US010066297B2

(12) United States Patent
Higashi et al.

(10) Patent No.: US 10,066,297 B2
(45) Date of Patent: Sep. 4, 2018

(54) TILED SHOWERHEAD FOR A SEMICONDUCTOR CHEMICAL VAPOR DEPOSITION REACTOR

(71) Applicant: Alta Devices, Inc., Sunnyvale, CA (US)

(72) Inventors: Gregg Higashi, San Jose, CA (US); Alexander Lerner, San Jose, CA (US); Khurshed Sorabji, San Jose, CA (US); Lori D. Washington, Union City, CA (US); Andreas Hegedus, Burlingame, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 366 days.

(21) Appl. No.: 14/924,488

(22) Filed: Oct. 27, 2015

(65) Prior Publication Data

US 2016/0047042 A1    Feb. 18, 2016

Related U.S. Application Data

(63) Continuation-in-part of application No. 13/222,890, filed on Aug. 31, 2011, now Pat. No. 9,175,393, and
(Continued)

(51) Int. Cl.
*C23C 16/455* (2006.01)
*C23C 16/44* (2006.01)
(Continued)

(52) U.S. Cl.
CPC .... *C23C 16/45565* (2013.01); *C23C 16/4412* (2013.01); *C23C 16/45519* (2013.01);
(Continued)

(58) Field of Classification Search
CPC ............ C23C 16/455; C23C 16/45563; C23C 16/45565; C23C 16/4582; C23C 16/4583
(Continued)

(56) References Cited

U.S. PATENT DOCUMENTS 4,993,358 A * 2/1991 Mahawili ...................... 118/715
5,059,770 A  10/1991 Mahawili
(Continued)

OTHER PUBLICATIONS

Book: D.M. Dobkin et al., "Principles of Chemical Vapor Deposition", 2003 Kluwer Academic Publishers, Chapter 3, 3 pages.

*Primary Examiner* — Rudy Zervigon
(74) *Attorney, Agent, or Firm* — Arent Fox LLP

(57) ABSTRACT

A showerhead for a semiconductor processing reactor formed by an array of showerhead tiles. Each showerhead tile has a plurality of process gas apertures, which may be in a central area of the tile or may extend over the entire tile. Each showerhead tile can be dimensioned for processing a respective substrate or a plurality of substrates or the array can be dimensioned for processing a substrate. An exhaust region surrounds the process gas apertures. The exhaust region has at least one exhaust aperture, and may include an exhaust slot, a plurality of connected exhaust slots or a plurality of exhaust apertures. The exhaust region surrounds the array of showerhead tiles, or a respective portion of the exhaust region surrounds the plurality of process gas apertures in each showerhead tile or group of showerhead tiles. A gas curtain aperture may be between the exhaust region and the process gas apertures of one of the showerhead tiles or adjacent to the central area of the tile.

20 Claims, 10 Drawing Sheets

Related U.S. Application Data a continuation-in-part of application No. 13/222,840, filed on Aug. 31, 2011, now Pat. No. 9,212,422.

(51) Int. Cl.
*H01J 37/32* (2006.01)
*H01L 21/67* (2006.01)
*H01L 21/677* (2006.01)

(52) U.S. Cl.
CPC .... *C23C 16/45572* (2013.01); *H01J 37/3244* (2013.01); *H01J 37/32449* (2013.01); *H01J 37/32834* (2013.01); *H01L 21/6776* (2013.01); *H01L 21/67115* (2013.01)

(58) Field of Classification Search
USPC ............... 118/715, 728; 156/345.33, 345.34, 156/345.51
See application file for complete search history.

(56) References Cited

U.S. PATENT DOCUMENTS

| | | | |
|---|---|---|---|
| 5,122,391 A * | 6/1992 | Mayer | 427/126.3 |
| 5,304,247 A * | 4/1994 | Kondo et al. | 118/715 |
| 5,304,398 A | 4/1994 | Krusell et al. | |
| 5,532,190 A * | 7/1996 | Goodyear et al. | 438/710 |
| 5,647,945 A | 7/1997 | Matsuse et al. | |
| 5,792,272 A | 8/1998 | Van Os et al. | |
| 6,001,267 A | 12/1999 | Os et al. | |
| 6,113,700 A | 9/2000 | Choi | |
| 6,143,080 A | 11/2000 | Bartholomew et al. | |
| 6,294,026 B1 | 9/2001 | Roithner et al. | |
| 6,368,567 B2 | 4/2002 | Comita et al. | |
| 6,821,563 B2 | 11/2004 | Yudovsky | |
| 6,821,910 B2 * | 11/2004 | Adomaitis et al. | 438/758 |
| 6,852,167 B2 * | 2/2005 | Ahn | 118/715 |
| 7,104,476 B2 * | 9/2006 | Kim | 239/557 |
| 7,153,542 B2 | 12/2006 | Nguyen et al. | |
| 7,410,668 B2 * | 8/2008 | Ahn | 427/248.1 |
| 7,429,410 B2 * | 9/2008 | Keller et al. | 427/578 |
| 7,484,473 B2 * | 2/2009 | Keller et al. | 118/723 R |
| 7,537,662 B2 * | 5/2009 | Soininen et al. | 118/715 |
| 7,601,223 B2 * | 10/2009 | Lindfors et al. | 118/715 |
| 7,718,030 B2 * | 5/2010 | Funk et al. | 156/345.29 |
| 7,789,961 B2 * | 9/2010 | Nelson et al. | 118/715 |
| 7,794,546 B2 * | 9/2010 | Li | 118/733 |
| 8,008,174 B2 | 8/2011 | He et al. | |
| 8,038,834 B2 * | 10/2011 | Funk et al. | 156/345.29 |
| 8,075,690 B2 * | 12/2011 | Keller et al. | 118/715 |
| 8,143,074 B2 * | 3/2012 | Day et al. | 438/5 |
| 8,236,106 B2 * | 8/2012 | Iizuka et al. | 118/715 |
| 8,277,888 B2 * | 10/2012 | Dedontney | 427/248.1 |
| 8,293,013 B2 * | 10/2012 | DeDontney | 118/715 |
| 8,298,338 B2 * | 10/2012 | Kim et al. | 118/715 |
| 8,334,015 B2 * | 12/2012 | Chiang et al. | 427/248.1 |
| 8,366,828 B2 * | 2/2013 | Iizuka | 118/715 |
| 8,398,770 B2 * | 3/2013 | Levy et al. | 118/718 |
| 8,402,845 B2 * | 3/2013 | Dedontney | 73/865.9 |
| 8,409,354 B2 * | 4/2013 | Chiang et al. | 118/719 |
| 8,440,259 B2 * | 5/2013 | Chiang et al. | 427/248.1 |
| 8,551,890 B2 * | 10/2013 | Goodlin et al. | 438/758 |
| 8,726,838 B2 * | 5/2014 | Shanker et al. | 118/723 E |
| 2002/0122885 A1 * | 9/2002 | Ahn | 427/255.28 |
| 2003/0207032 A1 * | 11/2003 | Ahn et al. | 427/255.34 |
| 2004/0166597 A1 | 8/2004 | Strang | |
| 2005/0087134 A1 * | 4/2005 | Ahn | 118/715 |
| 2005/0092248 A1 * | 5/2005 | Lee et al. | 118/715 |
| 2005/0255257 A1 * | 11/2005 | Choi et al. | 427/585 |
| 2006/0005771 A1 * | 1/2006 | White et al. | 118/728 |
| 2006/0060138 A1 * | 3/2006 | Keller et al. | 118/715 |
| 2006/0219362 A1 | 10/2006 | Han et al. | |
| 2006/0234514 A1 * | 10/2006 | Gianoulakis et al. | 438/758 |
| 2007/0068625 A1 * | 3/2007 | Funk et al. | 156/345.29 |
| 2007/0092732 A1 | 4/2007 | Rose et al. | |
| 2007/0107661 A1 * | 5/2007 | Ahn | 118/719 |
| 2007/0131169 A1 * | 6/2007 | Ahn | 118/715 |
| 2007/0215036 A1 | 9/2007 | Park et al. | |
| 2008/0000497 A1 * | 1/2008 | Verhaverbeke | 134/1.1 |
| 2008/0124463 A1 | 5/2008 | Bour et al. | |
| 2008/0198888 A1 | 8/2008 | Toshima | |
| 2009/0061083 A1 * | 3/2009 | Chiang et al. | 427/248.1 |
| 2009/0061644 A1 * | 3/2009 | Chiang et al. | 438/763 |
| 2009/0061646 A1 * | 3/2009 | Chiang et al. | 438/763 |
| 2009/0229754 A1 * | 9/2009 | Iizuka et al. | 156/345.34 |
| 2009/0236041 A1 * | 9/2009 | Iizuka | 156/345.34 |
| 2009/0236447 A1 | 9/2009 | Panagopoulos et al. | |
| 2009/0324379 A1 | 12/2009 | He et al. | |
| 2009/0325367 A1 | 12/2009 | He et al. | |
| 2010/0092668 A1 | 4/2010 | Hegedus | |
| 2010/0147370 A1 | 6/2010 | He et al. | |
| 2010/0193471 A1 * | 8/2010 | Funk et al. | 216/67 |
| 2010/0206229 A1 | 8/2010 | He et al. | |
| 2010/0206235 A1 | 8/2010 | He et al. | |
| 2010/0209082 A1 | 8/2010 | He et al. | |
| 2010/0209620 A1 | 8/2010 | He et al. | |
| 2010/0209626 A1 | 8/2010 | He et al. | |
| 2010/0212591 A1 | 8/2010 | He et al. | |
| 2010/0219509 A1 | 9/2010 | He et al. | |
| 2010/0229793 A1 | 9/2010 | He et al. | |
| 2010/0233879 A1 | 9/2010 | Ryan | |
| 2010/0300359 A1 * | 12/2010 | Armour et al. | 118/724 |
| 2011/0132542 A1 * | 6/2011 | Iizuka | 156/345.33 |
| 2011/0214812 A1 * | 9/2011 | Song et al. | 156/345.33 |
| 2011/0214814 A1 * | 9/2011 | Iizuka et al. | 156/345.34 |
| 2011/0268880 A1 | 11/2011 | Bour | |
| 2012/0234230 A1 | 9/2012 | Halpin et al. | |
| 2012/0321786 A1 | 12/2012 | Satitpunwaycha et al. | |
| 2013/0052346 A1 | 2/2013 | Higashi et al. | |

* cited by examiner

TILED SHOWERHEAD FOR A SEMICONDUCTOR CHEMICAL VAPOR DEPOSITION REACTOR

CROSS-REFERENCE TO RELATED APPLICATION

This application is a continuation-in-part of U.S. patent application Ser. No. 13/222,890 filed on Aug. 31, 2011 and a continuation-in-part of U.S. patent application Ser. No. 13/222,840 filed on Aug. 31, 2011 from both of which the benefit of priority is claimed and which are both hereby incorporated by reference.

TECHNICAL FIELD

The field of the present disclosure relates to semiconductor processing and showerhead reactors, particularly to showerheads for chemical vapor deposition reactors.

BACKGROUND

Various deposition and etching processes and tools are used in semiconductor wafer processing such as for integrated circuits, solar photovoltaic cells and micro-machining. Two predominant types of reactors used in semiconductor processing are the tube-type reactor and the showerhead-type reactor, which are discussed in "Principles of Chemical Vapor Deposition" by Daniel M. Dobkin and Michael K. Zuraw, 2003, Kluwer Academic Publishers.

Typically, a chemical vapor deposition (CVD) showerhead reactor operates on a single wafer per chamber and thus has much lower wafer throughput than a CVD tube reactor, which handles many wafers in parallel in a single load. In a showerhead reactor, gases are distributed to a wafer from a showerhead (alternately, shower head). In a tube reactor, gases are distributed to a parallel-spaced set of wafers in a boat, with the gases traveling from an inlet at one end of the tube to an exhaust at the other end of the tube. Showerhead reactors are often run at a higher deposition rate in order to improve throughput for commercial viability.

Tube reactors and showerhead reactors are often known as hot-wall and cold-wall reactor designs respectively, with the tube reactor normally operated as nearly isothermal and the showerhead reactor having large temperature gradients from one part of the reactor to another. Generally, for plasma generation, showerhead reactors are preferred as compared to tube reactors, as tube-type plasma reactors have difficulties in mechanical design, particle control, electrical design and wafer handling. Tube reactors are suitable for processes requiring good temperature uniformity and high temperatures, such as polysilicon deposition. Showerhead reactors are suitable for lower temperature plasma-based processes including deposition of various materials and etching.

Plasma reactors often use a metallic showerhead as one plasma electrode, and a wafer in electrical connection with a chuck as the other plasma electrode. Walls of the chamber in which the showerhead and the wafer are mounted are generally held at ground potential for safety reasons. Electrons in the plasma lose energy to the chamber walls upon collision with the walls. Plasma enhanced chemical vapor deposition (PECVD) is often preferred in semiconductor processing as compared to physical vapor deposition (PVD), as films deposited by PECVD conformally cover processed wafer topographies, filling trenches or holes, and have superior electrical properties and lower defect densities.

Plenum dimensions and diameter, angle, and placement of holes in the showerhead affect flow of process gases. Generally, the showerhead has a diameter that is approximately the same as or is slightly larger than the silicon wafer or substrate being processed, as does the chuck supporting the wafer or substrate. Multiple gas plenums may be arranged in circumferential rings in or above the showerhead, for dispensing multiple gases without mixing in the plenum.

US Patent Application Publication No. 2010/0233879 A1 discloses a single-wafer, multiple-showerhead, multiple-chuck reactor. A wafer is moved to four or five different chucks for deposition of a portion of a film at each chuck. Each showerhead introduces its own random nonuniformities. Using several chucks averages out the random nonuniformities.

Improvements in showerhead reactors are sought. It is a goal of the present invention to improve processing throughput in showerhead reactors.

SUMMARY

A goal of improving processing throughput in showerhead reactors is met with a tiled showerhead for a semiconductor-processing showerhead reactor. A showerhead "tile" is a showerhead with an array of gas outflow apertures. A showerhead tile can be about the same size as, or larger than or smaller than a standard showerhead. A tiled showerhead can be built up to a size that is larger than a standard showerhead. Some tiles can include exhaust ports and/or fluid temperature control, while other tiles rely on surrounding infrastructure for exhaust and/or fluid temperature control. Showerhead tiles enable a tiled showerhead to be scaled upwards or downwards by adding or subtracting repeated copies of a showerhead tile in a modular manner.

A tiled showerhead has an array of showerhead tiles that fit together in a defined area. Each of the showerhead tiles has a plurality of process gas apertures. Each tile can be dimensioned for processing a respective substrate or a plurality of substrates or the entire array can be dimensioned for processing an areawise substrate. The tiled showerhead can be used for simultaneous processing of semiconductor wafers or similar substrates.

In one embodiment, each showerhead tile has fluid passageways adjacent to the central area of the tile. The fluid passageways may include cooling plenums, or exhaust gas passageways connected to gas curtain apertures. Sometimes an exhaust region, with an exhaust aperture, surrounds the central area of the showerhead tile.

In a further embodiment, each showerhead tile has at least one fluid passageway adjacent to the central area of the tile. The fluid passageway may include cooling plenums, or gas passageways connected to gas curtain apertures for reactive gas deposition on a substrate of corresponding size.

DETAILED DESCRIPTION

Figure 12:
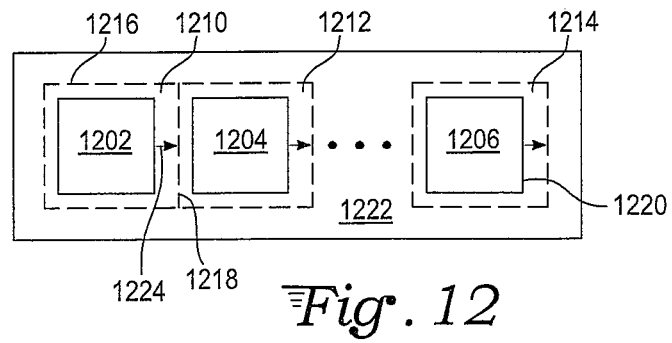
FIG. 12 is a top plan view of semiconductor substrates being processed in series in a modular showerhead reactor.
Figure 13:
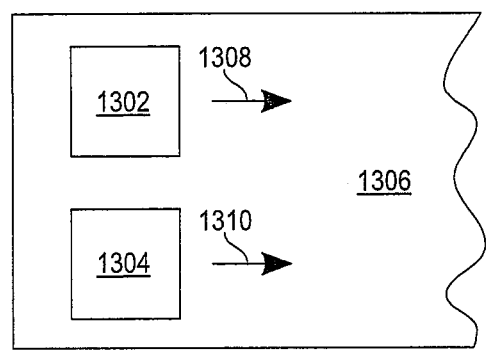
FIG. 13 is a top plan view of semiconductor substrates being processed in parallel in a showerhead reactor of the kind shown in FIG. 10.

With reference to FIGS. 1-9, showerhead tiles, tiled showerheads and a showerhead fixture in accordance with the present invention are shown. The tiled showerhead has an array of showerhead tiles in a modular areawise arrangement. A tiled showerhead is suitable for use in simultaneously processing multiple semiconductor wafers in the showerhead reactors of FIGS. 10 and 11, thereby improving wafer processing throughput as compared to a single-wafer showerhead reactor. Examples of semiconductor wafers or other substrates being processed in a showerhead reactor are shown in FIGS. 12-14. Examples of further arrays of the tiled showerheads are shown in FIGS. 15A-15G.

A tiled showerhead can process multiple substrates in a variety of showerhead reactors. A single fixture having a tiled showerhead can be used in a single-chamber showerhead reactor, to process multiple substrates in one or a series of processing actions in the chamber. Multiple tiled showerheads can be used in a long, linear showerhead reactor having multiple reaction chambers, each chamber having a respective tiled showerhead, to process multiple substrates in parallel in each chamber and in series in successive chambers. A modular showerhead reactor, using modular reactors each having one or more chambers with respective tiled showerheads, can be assembled to process multiple substrates in parallel in each chamber and in series in successive chambers. Respective chambers have physical walls, gas isolation walls and/or exhaust zones in various combinations surrounding the chamber and/or separating the chamber from an adjacent chamber.

Figure 1:
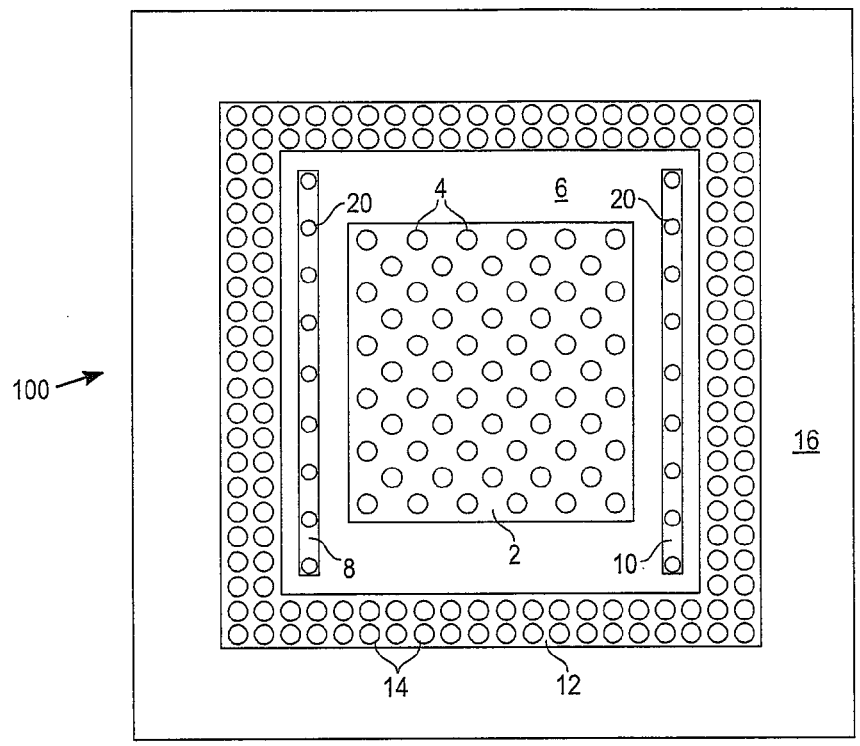
FIG. 1 is a top plan view of an exemplary showerhead tile in accordance with the present invention.
Figure 3:
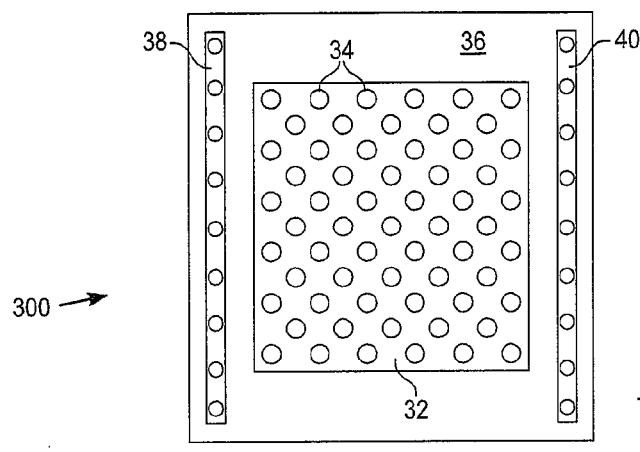
FIG. 3 is a top plan view of a showerhead tile that is an alternate embodiment of the showerhead tile of FIG. 1.
Figure 5:
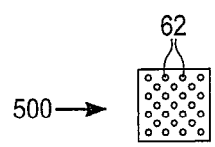
FIG. 5 is a top plan view of a showerhead tile that is an alternate embodiment of the showerhead tiles of FIGS. 1 and 3.

The showerhead tiles 100, 300 and 500 shown in FIGS. 1, 3 and 5 respectively are square and have a square central area with a plurality of process gas apertures. Such square showerhead tiles are suitable for processing square semiconductor wafers, such as used in certain types of photovoltaic solar cells, and suitable for processing round semiconductor wafers of a diameter less than or approximately equal to the length of a side of the square central area with the process gas apertures. Other shapes of showerhead tiles and various regions on the tile, such as hexagonal, rectangular, polygonal or round, may be devised by a person skilled in the art. Tiles are connected by welding and so a slight amount of tile border area is provided for a weld bead. Alternative connections can be used, such as bolting. In this regard, each tile can be surrounded by flanges for connection or for cooling or for exhaust.

With reference to FIG. 1, the showerhead tile 100 has a square central area 2, with a plurality of process gas apertures 4, surrounded by a square ring region 6. The square ring region 6 includes two fluid passageways 8 and 10, which are adjacent to the central area 2 of the showerhead tile 100. The square ring region 6 is surrounded by an exhaust region 12, which has a plurality of exhaust apertures 14 and is in the shape of a further square ring. The exhaust region 12 includes a contiguous exhaust slot, a plurality of connected exhaust slots or a plurality of holes of various shapes or sizes as may readily be devised. A flange 16 in the shape of a still further square ring surrounds the exhaust region 12. From the central area 2 outward, the showerhead tile 100 thus has concentric regions for process gas apertures 4, fluid passage, exhaust apertures 14 and a flange 16.

The fluid passageways 8 and 10 are used for two differing purposes in embodiments of the showerhead tile 100, namely cooling in first and third embodiments and provision of a gas curtain in second and third embodiments. In a first embodiment, the two fluid passageways 8 and 10 are connectable to circulate a cooling fluid, which cools the showerhead tile 100.

In a second embodiment, the two fluid passageways 8 and 10 are connectable to a gas supply and provide an isolation gas curtain through gas curtain apertures 20 of the showerhead tile 100. The gas curtain apertures 20 are fluidly connected to the two fluid passageways 8 and 10. Hydrogen is suitable as a gas for the gas curtain. In a further example, nitrogen is suitable as a gas for the gas curtain. Further gases suitable for the gas curtain can be devised.

In a third embodiment, each of the two fluid passageways 8 and 10 acts as a cooling plenum and is open on the surface of the showerhead tile 100 facing a wafer being processed. Hydrogen or other gas passing through the fluid passageways 8 and 10 cools the showerhead tile 100 through heat transfer from the showerhead tile 100 to the gas in the cooling plenum. The hydrogen or other gas proceeds outward from the cooling plenum to form a gas curtain. Each of the two fluid passageways 8 and 10 thus provides a gas curtain and a cooling to the showerhead tile 100.

Figure 2:
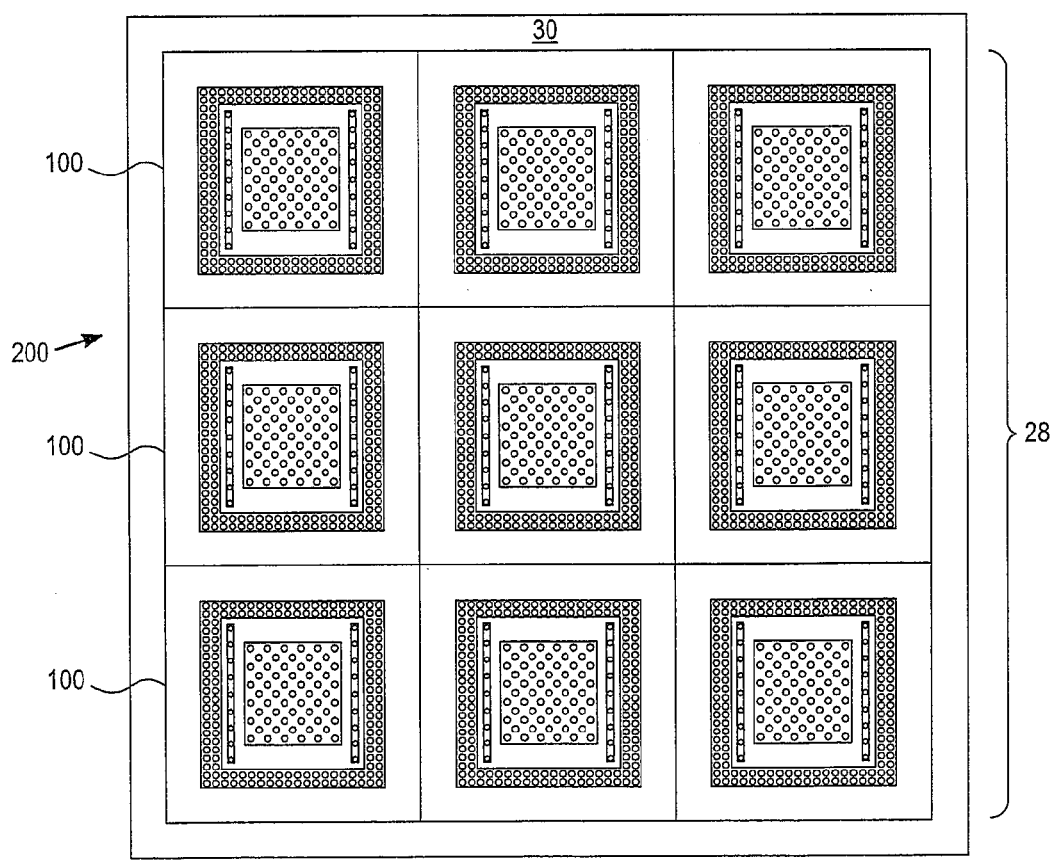
FIG. 2 is a top plan view of a tiled showerhead formed by an array of the showerhead tiles of FIG. 1.

With reference to FIG. 2, a tiled showerhead 200 has a three by three array 28 of the showerhead tile 100 of FIG. 1. A flange 30 in the shape of a square ring surrounds the array 28 of showerhead tiles 100. The tiled showerhead 200 can be used to process a number of semiconductor wafers. In one example, the number of semiconductor wafers processed, is equal to the number of showerhead tiles in the array of showerhead tiles. In this example, there are nine showerhead tiles 100. Thus, in one example, the tiled showerhead 200 can process nine semiconductor wafers simultaneously e.g. in a three by three array of wafers, in a suitable showerhead reactor. In another example, each tile 100 of the tiled showerhead 200 can process a plurality of semiconductor wafers or substrates. For example, one tile of an array can process 4, 6 or 9 wafers or substrates or any other desired number of wafers or substrates. In the example where each tile 100 of the showerhead 200 processes 4 substrates, 36 substrates are processed by the tiled showerhead 200. Where each tile 100 of the showerhead 200 processes 6 substrates, 54 substrates are processed by the tiled showerhead 200 and where each tile 100 of the showerhead 200 processes 9 substrates, 81 substrates are processed by the tiled showerhead 200.

Figure 4:
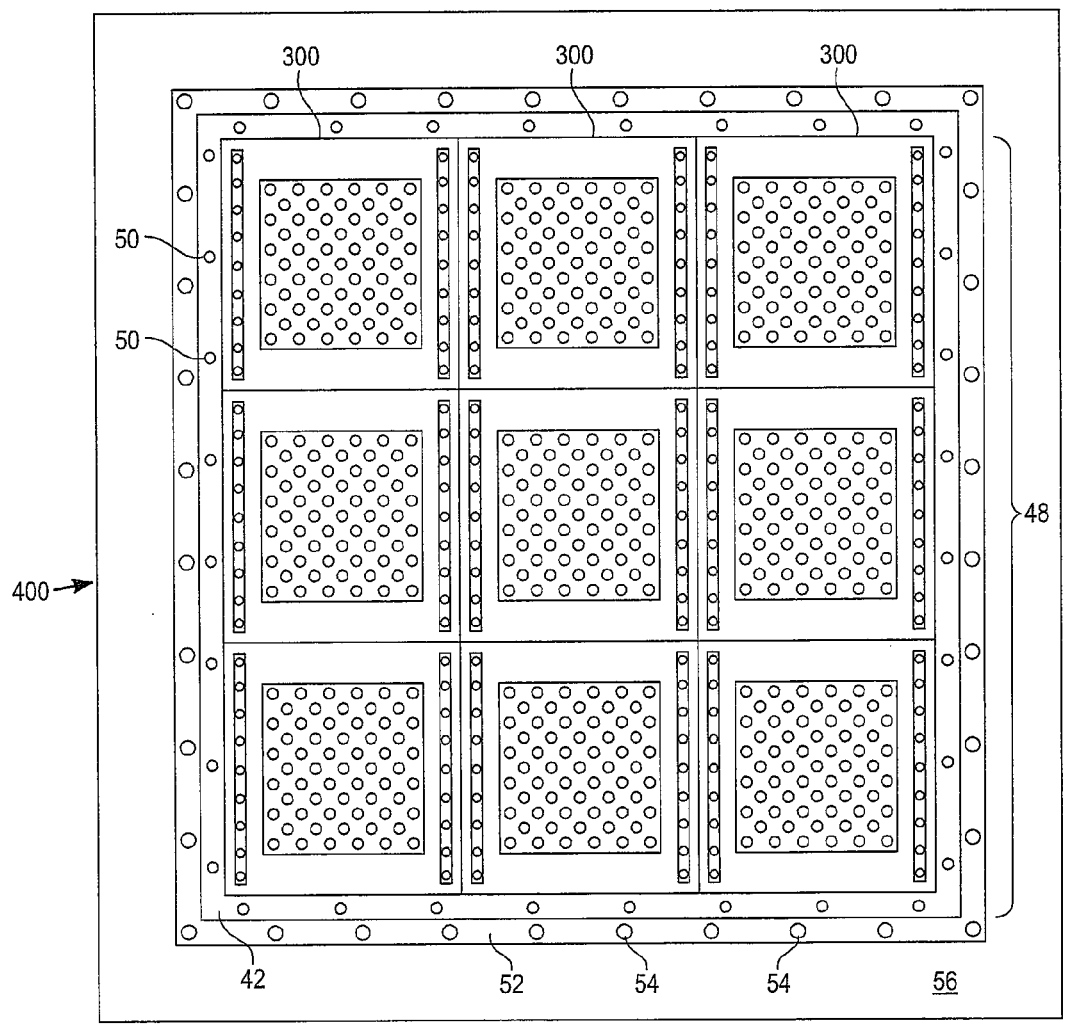
FIG. 4 is a top plan view of a tiled showerhead that is an alternate embodiment of the tiled showerhead of FIG. 2, formed by an array of the showerhead tile of FIG. 3.

With reference to FIGS. 3 and 4, a more compact tiled showerhead 400 can be devised by moving the exhaust apertures from the showerhead tiles to the tiled showerhead 400. In FIG. 3, the showerhead tile 300 has a square central area 32 with a plurality of process gas apertures 34. The square central area 32 is surrounded by a square ring region 36 that includes two fluid passageways 38 and 40 adjacent to the central area 32 of the showerhead tile 300. The showerhead tile 300 lacks the exhaust region of the showerhead tile 100 and is thus more compact than the showerhead tile 100. In first, second and third variations of the showerhead tile 300, the fluid passageways 38 and 40 perform similar functions and are configured similarly to the fluid passageways 8 and 10 of the showerhead tile 100.

In FIG. 4, the tiled showerhead 400 has a three by three array 48 of the showerhead tile 300 of FIG. 3. A gas curtain region 42, in the shape of a square ring, surrounds the array 48 of showerhead tiles 300 and has a plurality of gas curtain apertures 50. An exhaust region 52, in the shape of a further square ring and with a plurality of exhaust apertures 54, surrounds the gas curtain region 42 and the array 48 of showerhead tiles 300. In variations, the exhaust region 52 includes a contiguous exhaust slot, a plurality of connected exhaust slots or a plurality of holes of various shapes or sizes as may readily be devised. A flange 56, in the shape of a still further square ring, surrounds the exhaust region 52. As a result of using the more compact showerhead tile 300 as compared with the showerhead tile 100, the tiled showerhead 400 is more compact than the tiled showerhead 200.

A three by three array of wafers being processed using the tiled showerhead 400 can be more compact than a three by three array of wafers being processed using the tiled showerhead 200. A showerhead reactor using the tiled showerhead 400 can be more compact than a showerhead reactor using the tiled showerhead 200.

With reference to FIGS. 5-8, further variations of tiled shower heads such as the tiled showerhead 700 and the tiled showerhead 800 can be devised by grouping showerhead tiles. In FIG. 5, the showerhead tile 500 has a plurality of process gas apertures 62. As depicted, the showerhead tile 500 lacks gas curtain apertures or exhaust apertures and is thus more compact than showerhead tiles having gas curtain apertures and/or exhaust apertures. Further variations of tiled shower heads having grouped showerhead tiles can be devised using showerhead tiles having gas curtain apertures, exhaust apertures or both.

Figure 6:
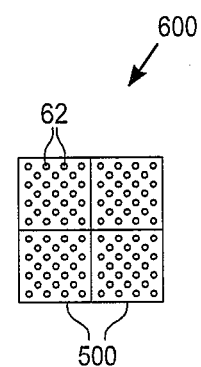
FIG. 6 is a top plan view of an array of showerhead tiles formed by the showerhead tiles of FIG. 5.
Figure 7A:
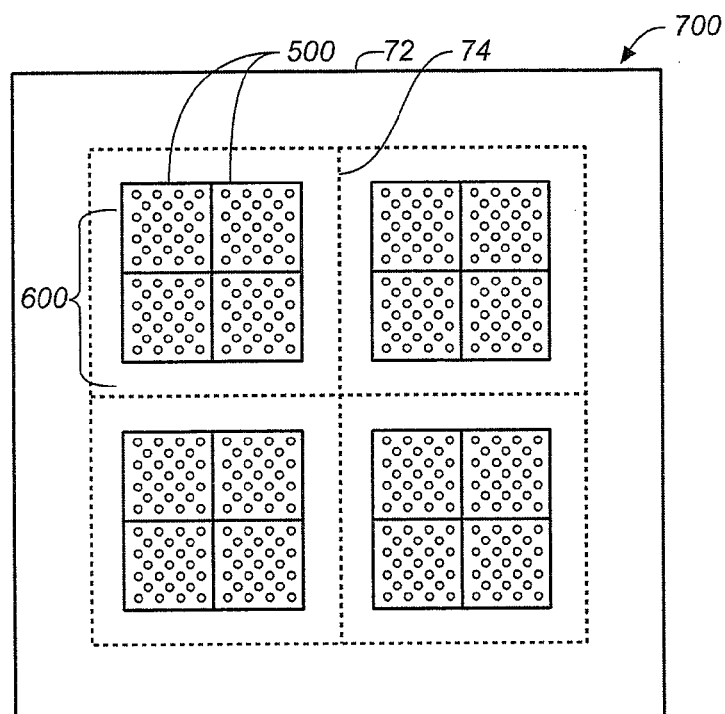
FIG. 7A is a top plan view of a tiled showerhead that is an alternate embodiment of the tiled showerheads of FIGS. 2 and 4, using arrays shown in FIG. 6.
Figure 8A:
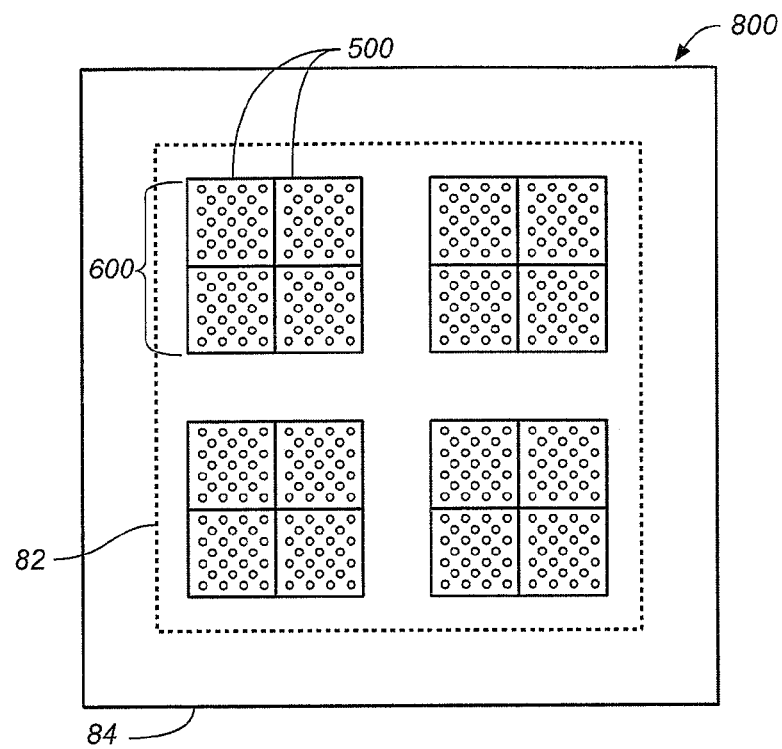
FIG. 8A is a top plan view of a tiled showerhead that is an alternate embodiment of the tiled showerheads of FIGS. 2, 4, and 7A, using the arrays shown in FIG. 6.

In FIG. 6, a two by two array 600 of showerhead tiles 500 is formed as a grouping of showerhead tiles. In the tiled showerheads 700 and 800 in FIGS. 7A and 8B, the array 600 of showerhead tiles 500 is repeated in a two by two array of arrays 600 of showerhead tiles 500. Various further arrays of arrays, arrays of groupings, groupings of arrays, groupings of groupings and so on can be devised by a person skilled in the art. An array 600 of showerhead tiles 500 can be surrounded by a combination of perimeter exhaust regions 72 and inter-array exhaust regions 74 as shown in FIG. 7A, or all of the arrays 600 of showerhead tiles 500 can be surrounded by a perimeter exhaust region 82 as shown in FIG. 8A. In various examples, exhaust regions employ a plurality of exhaust apertures, a single opening or slot, multiple interconnected openings or slots or other combinations for exhausting as may be devised by a person skilled in the art. In variations, gas isolation regions can be added surrounding the arrays 600. Gas isolation regions can be between a portion of an exhaust region and at least one of the gas curtain apertures, such as between the exhaust region and one of the showerhead tiles, between groups of showerhead tiles, between a group of showerhead tiles and a portion of an exhaust region and so on. A flange 76, 84, 77 or 85 or other region can surround the exhaust region in various examples.

Figure 7B:
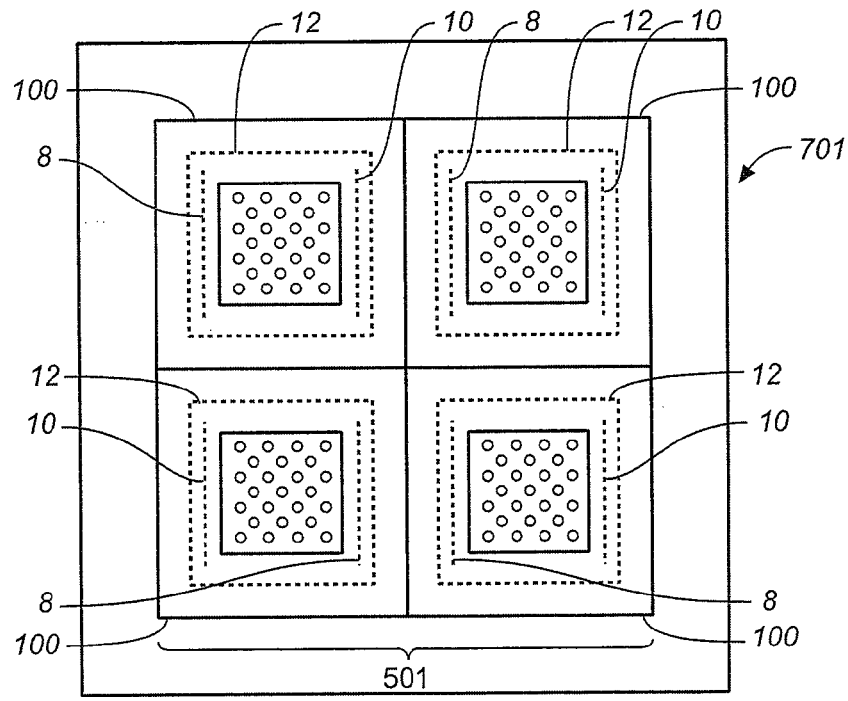
FIG. 7B is a top plan view of another tiled showerhead that is an alternate embodiment of the tiled showerhead of FIG. 2.

As shown in FIG. 7B, showerhead 701 comprises fewer individual showerhead tiles 100 than seen in showerhead 200 of Fig. 2. For example, an array of four tiles 501 can be used in the showerhead. A central square ring region of each tile 100 may be surrounded by an exhaust region 12 and the tile may have fluid passageways 8, 10 as represented by dashed lines and as discussed previously with regard to tile 100.

Figure 8B:
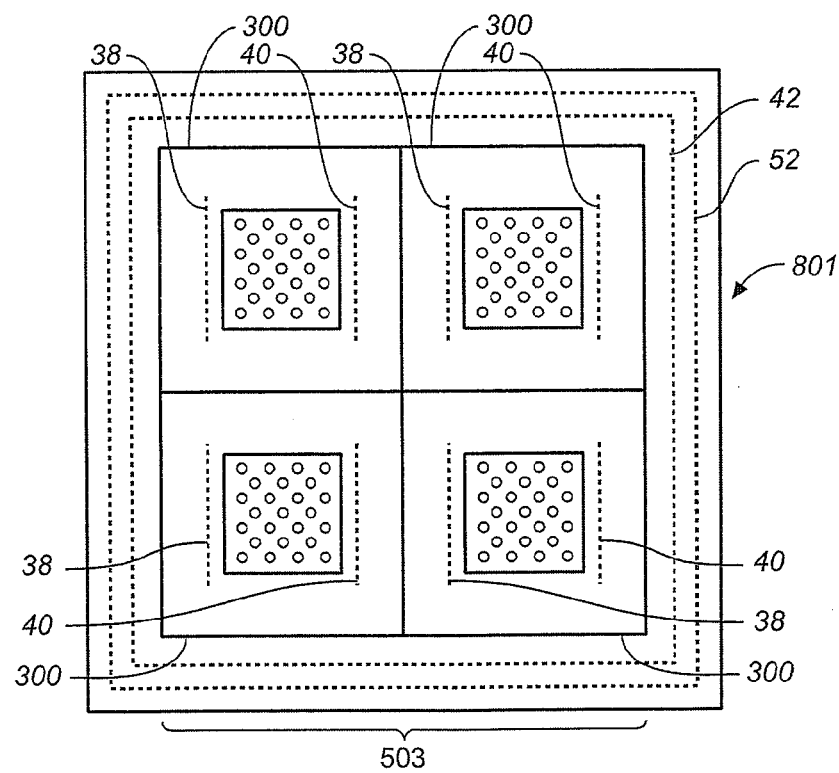
FIG. 8B is a top plan view of another tiled showerhead that is an alternate embodiment of the tiled showerhead of FIG. 4.

As shown in FIG. 8B, showerhead 801 comprises fewer individual showerhead tiles 300 than seen in showerhead 400 of FIG. 3. For example, an array of four tiles 503 can be used in the showerhead. The array of tiles 300 may be surrounded by and exhaust region 52 and a gas curtain region 42 and include two fluid passageways 38 and 40 represented by dashed lines as discussed previously with regard to tile 300.

Figure 9:
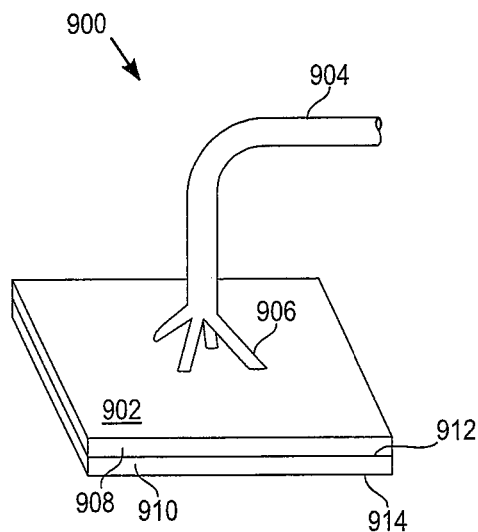
FIG. 9 is a perspective view of a showerhead fixture, including a showerhead assembly and a gas distribution conduit, suitable for using the tiled showerheads of FIG. 2, 4, 7, or 8.

With reference to FIG. 9, a gas conduit 904 with multiple branches 906 provides gas flow to a showerhead assembly 902 in a showerhead fixture 900. The showerhead assembly 902 includes one or more plenums 908 and 910, and one or more diffuser plates 912, as well as a showerhead plate 914. The showerhead assembly 902 can use a conventional showerhead or can use one of the tiled showerheads of FIG. 2, 4, 7 or 8. Each branch 906 of the gas conduit 904 provides a gas flow to a respective showerhead tile or group of showerhead tiles. Conduits for a gas isolation curtain and/or an exhaust are readily devised in accordance with the disclosure. In variations, each showerhead tile or each group of showerhead tiles has a respective gas distribution line or multiple gas distribution lines.

Variations of the showerhead assembly 902 are dimensioned and equipped according to the number and arrangement of showerhead tiles in the array of tiles. The plenum or plenums should be large enough for an even distribution of gases. A larger showerhead for a larger array of showerhead tiles should have a taller plenum, more plenums and/or more diffuser plates. Conversely, a smaller showerhead for a lesser number of showerhead tiles in a smaller array of showerhead tiles may have a shorter plenum, fewer plenums and/or fewer diffuser plates.

Figure 10:
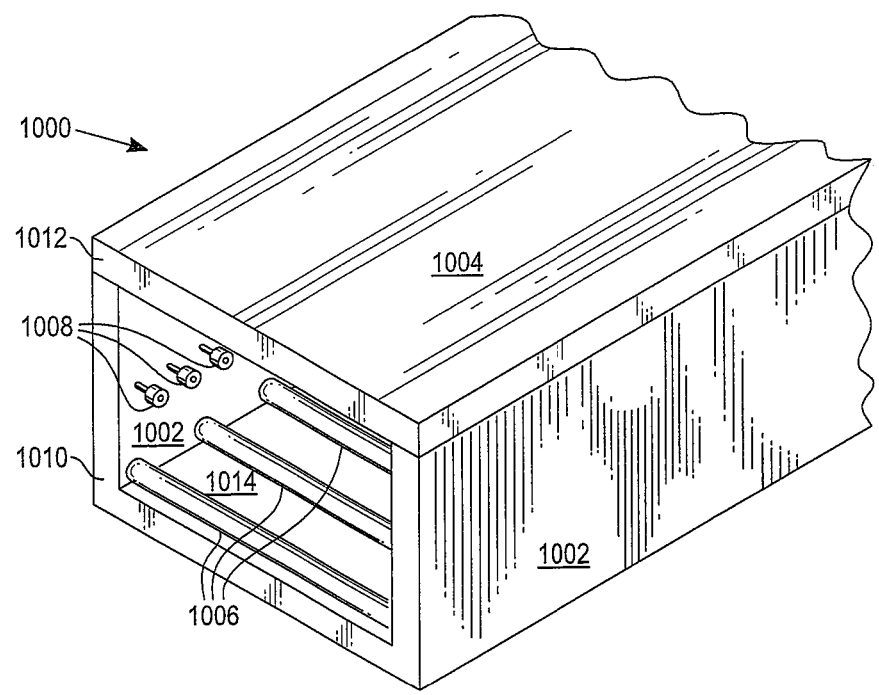
FIG. 10 is a perspective view of an entry or exit port of a showerhead reactor, suitable for using the showerhead fixture of FIG. 9.

With reference to FIG. 10, a showerhead reactor 1000 can be used for simultaneously processing multiple semiconductor wafers or other substrates, by employing one or more of the tiled showerhead 200, 400, 700, 800 or variation thereof in each of one or more reaction chambers. One or more reaction or processing chambers, isolation zones, transit zones and/or other regions or zones are enclosed by the reactor walls 1002, reactor floor 1014 and reactor lid 1004. A roller assembly 1008 or other transport mechanism moves wafers or other substrates, which may be on a wafer or substrate carrier, through the showerhead reactor 1000. Heating units 1006, such as infrared lamps, electrical resistive heaters, inductive heating units or other heat sources as may be devised, can heat the wafers or other substrates.

Each of the showerhead tiles 100, 300 or 500 in a tiled showerhead 200, 400, 700, 701, 800 or 800 or variation thereof distributes process gas to a respective wafer or plurality of wafers or substrates in the showerhead reactor 1000. In variations, a gas curtain is provided by the second or the third variation of the showerhead tile 100 as in the tiled showerhead 200, or by the tiled showerhead 400 or examples of the tiled showerhead 700. 701, 800 or 801. Exhaust is provided by each of the showerhead tiles 100 in the tiled showerhead 200 or by the tiled showerhead 400, 700, 701, 800 or 801.

Figure 11A:
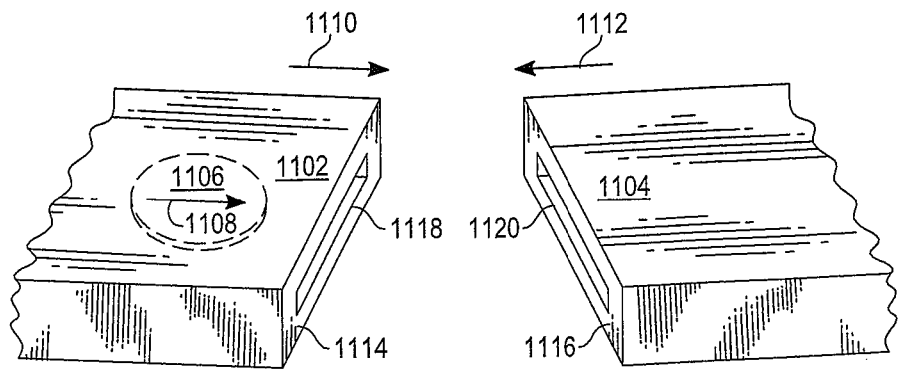
FIG. 11A is a perspective view of an entry and exit ports of two adjoining modular showerhead reactors.
Figure 11B:
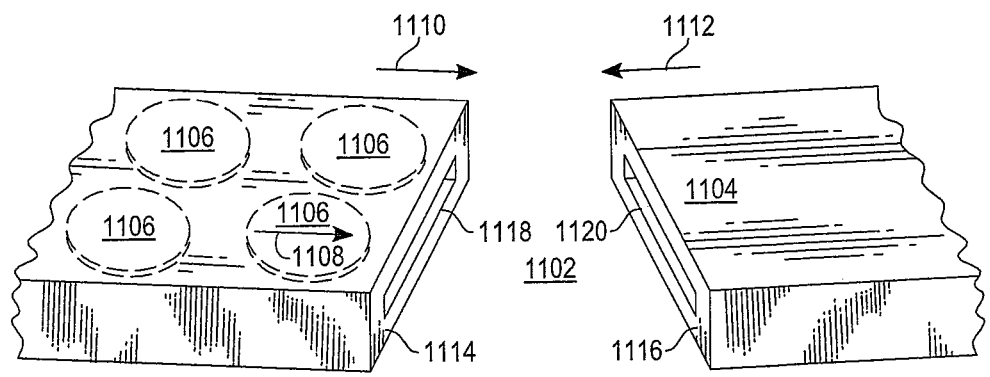
FIG. 11B is a perspective view of an entry and exit ports of the two adjoining modular showerhead reactors of FIG. 11A with a plurality of substrates.

With reference to FIG. 11A, a semiconductor wafer 1106 or other substrate or, with reference to FIG. 11B, a plurality of wafers or substrates 106 in can be processed in a first showerhead reactor 1102 and subsequently processed in a second showerhead reactor 1104. The wafer 1106 or plurality of wafers 1107 can be moved in a forward direction 1108 and transferred out of an exit 1118 of the first showerhead reactor 1102, then transferred into an entrance 1120 of a second showerhead reactor 1104.

In a modular showerhead reactor, the first showerhead reactor 1102 is a showerhead reactor module and the second showerhead reactor 1104 is a further showerhead reactor module, which can be the of the same or of differing construction and characteristics. In one embodiment of a modular showerhead reactor, the first and second showerhead reactors 1102, 1104 are modules and are moved in directions 1110, 1112 toward each other. The exit face 1114 of the first showerhead reactor 1102 is fastened to the entrance face 1116 of the second showerhead reactor 1104 with appropriate hardware and sealing. A substrate or substrates can pass directly from the first showerhead reactor 1102 to the second showerhead reactor 1104.

With reference to FIGS. 12-14, various parallel and series processing arrangements are shown for processing one or more semiconductor wafers or other substrates in a showerhead reactor. In FIG. 12, wafers 1202, 1204 and 1206 or other substrates are processed in series in the showerhead reactor 1000 or variation thereof. Each processing region 1210, 1212, 1214 is surrounded by a protection zone as provided by a perimeter protection zone 1216 and an inter-substrate protection zone 1218 or an individual perimeter protection zone 1220, with each protection zone providing a gas isolation curtain, an exhaust or both. Each wafer 1202 moves in a forward direction 1224 from one processing region 1210 to another processing region 1212 along a path 1222 from an entrance of the reactor to an exit of the reactor.

In FIG. 13, two wafers 1302 and 1304 or other substrates are processed and move in a forward direction 1308, 1310 in parallel along a path 1306 through the showerhead reactor 1000 or variation thereof. Dimensions of the reactor and dimensions or arrangements of showerheads are formed accordingly.

Figure 14A:
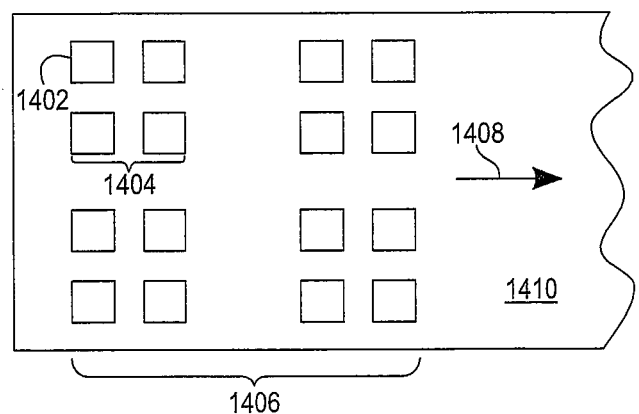
FIG. 14A is a top plan view of groups of semiconductor substrates being processed in parallel in a showerhead reactor of the kind shown in FIG. 10.

In FIG. 14A, a plurality of wafers 1402 or other substrates are processed and move in a forward direction 1408 in parallel along a path 1410 through the showerhead reactor 1000 or variation thereof, dimensioned accordingly. The plurality of wafers 1402 is shown as an array of tiles, grouped such that the array of tiles is an array of groups of tiles. A group 1406 of wafers is an array of four groups 1404 of wafers. Each group 1404 has four wafers 1402. In one example, each of the sixteen wafers 1402 in the group 1406 is associated with a respective one of the showerhead tiles 500 in a tiled showerhead 700 or 800, for processing when the wafers are positioned under the tiled showerhead 700 or 800 inside of a showerhead reactor 1000. In another example, each group of wafers 1404 of the larger group 1406 is associated with a respective one of the showerhead tiles 100 or 300 in a tiled showerhead 701 or 801, for processing when the wafers are positioned under the tiled showerhead 701 or 801 inside of a showerhead reactor 1000. The sizes and shapes of the showerhead tiles vary depending on the sizes, shapes and/or number of wafers to process. Thus only four of the showerhead tiles 100 or 300 are required to process 16 substrates 1402. As an example, after the sixteen wafers 1402 in the group 1406 are processed in a reaction or processing zone under a tiled showerhead 700, 701, 800 or 801, the wafers are moved to a subsequent reaction or processing zone and further processed under another tiled showerhead applying similar or different gases and conditions.

Figure 14B:
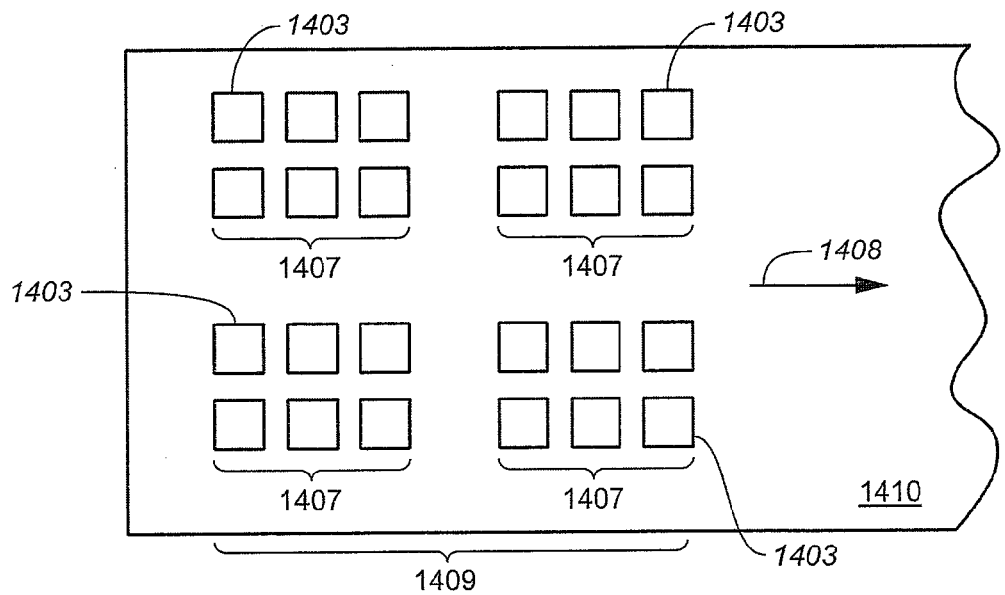
FIG. 14B is another top plan view of groups of semiconductor substrates being processed in parallel in a showerhead reactor of the kind shown in FIG. 10.

In FIG. 14b, a plurality of wafers 1403 or other substrates are processed and move in a forward direction 1408 in parallel along a path 1410 through the showerhead reactor 1000 or variation thereof, dimensioned accordingly. The plurality of wafers 1403 is shown as an array of tiles, grouped such that the array of tiles is an array of groups of tiles. A group 1409 of wafers is an array of four groups 1407 of wafers. Each group 1407 has six wafers 1403. In one example, each of the twenty four wafers 1403 in the group 1407 is associated with a respective one of the showerhead tiles 500 in a tiled showerhead (not shown), for processing when the wafers are positioned under the tiled showerhead inside of a showerhead reactor 1000. In another example, each group of wafers 1407 of the larger group 1409 is associated with a respective one of the showerhead tiles 100 or 300 in a tiled showerhead 701 or 801, for processing when the wafers are positioned under the tiled showerhead 701 or 801 inside of a showerhead reactor 1000. The sizes and shapes of the showerhead tiles vary depending on the sizes, shapes and/or number of wafers to process. As an example, after the twenty four wafers 1403 in the group 1409 are processed in a reaction or processing zone under a tiled showerhead 701 or 801, the wafers are moved to a subsequent reaction or processing zone and further processed under another tiled showerhead applying similar or differing gases and conditions.

Figure 14C:
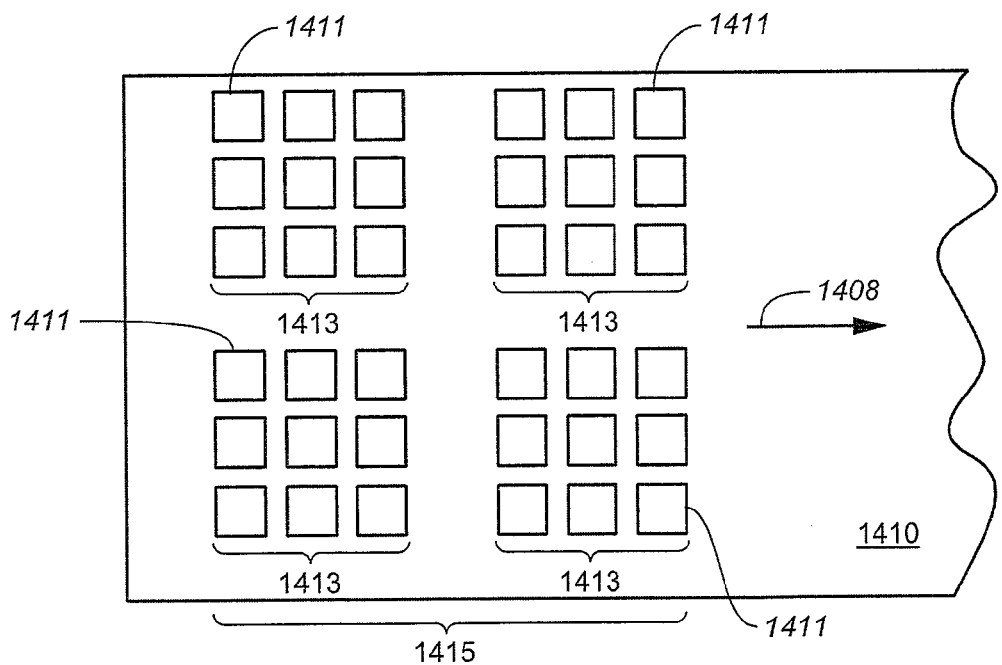
FIG. 14C is an additional top plan view of groups of semiconductor substrates being processed in parallel in a showerhead reactor of the kind shown in FIG. 10.

In FIG. 14c, a plurality of wafers 1411 or other substrates are processed and move in a forward direction 1408 in parallel along a path 1410 through the showerhead reactor 1000 or variation thereof, dimensioned accordingly. The plurality, of wafers 1411 is shown as an array of tiles, grouped such that the array of tiles is an array of groups of tiles. A group 1415 of wafers is an array of four groups 1413 of wafers. Each group 1413 has nine wafers 1403. In one example, each of the thirty six wafers 1411 in the group 1415 is associated with a respective one of the showerhead tiles in a tiled showerhead (not shown) for processing when the wafers are positioned under the tiled showerhead inside of a showerhead reactor 1000. In another example, each group of wafers 1413 of the larger group 1415 is associated with a respective one of the showerhead tiles 500 in a tiled showerhead 701 or 801, for processing when the wafers are positioned under the tiled showerhead 701 or 801 inside of a showerhead reactor 1000. The sizes and shapes of the showerhead tiles vary in size depending on the sizes, shapes and/or number of wafers to process. As an example, after the thirty six wafers 1411 in the group 1415 are processed in a reaction or processing zone under a tiled showerhead 701 or 801, the wafers are moved to a subsequent reaction or processing zone and further processed under another tiled showerhead applying similar or differing gases and conditions.

Figure 15A:
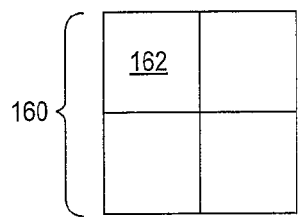
FIGS. 15A-15G are examples of arrays of showerhead tiles of the kind shown in FIGS. 1, 3, 5, and 6.
Figure 15B:
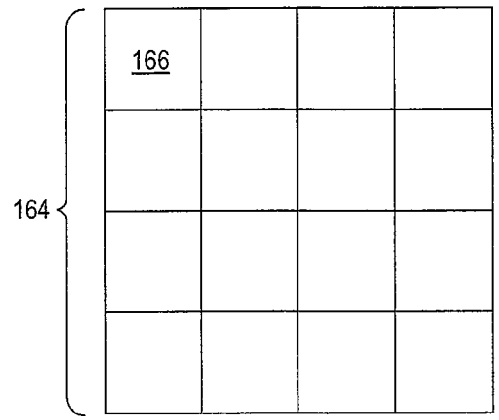
Figure 15C:
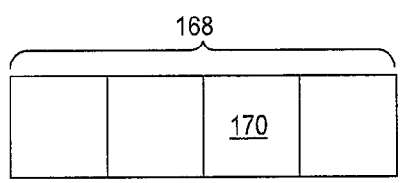
Figure 15D:
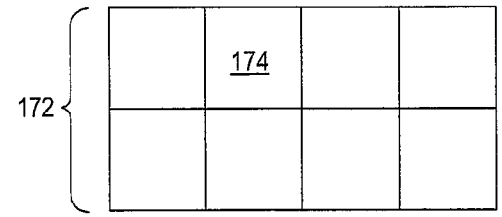
Figure 15E:
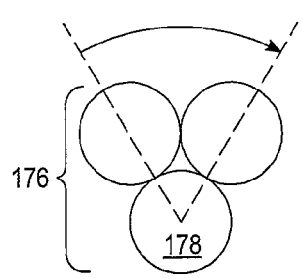
Figure 15F:
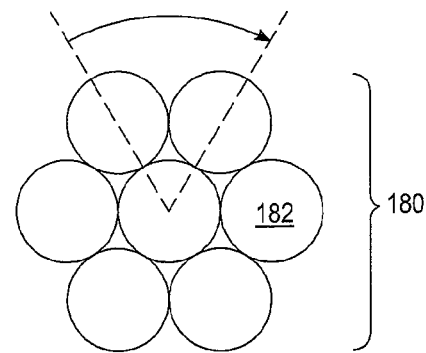
Figure 15G:
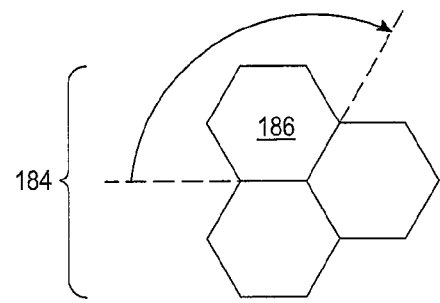

With reference to FIGS. 15A-15G, further embodiments of the tiled showerhead 200, 400, 700, 701, 800, or 801 use various arrays of various shapes of showerhead tiles. FIG. 15A shows a two by two square array 160 of square shapes 162. FIG. 15B shows a four by four square array 164 of square shapes 166. FIG. 15C shows a one by four or a four by one rectangular array 168 of square shapes 170. A rectangular array of width equal to one is also known as a linear array. FIG. 15D shows a two by four or a four by two rectangular array 172 of square shapes 174. FIG. 15E shows a triangular array 176 of circular shapes 178, which has one hundred and twenty degree rotational symmetry. FIG. 15F shows a hexagonal or honeycomb array 180 of circular shapes 182, which has sixty degree, one hundred and twenty degree and one hundred and eighty degree rotational symmetry. FIG. 15G shows a hexagonal or honeycomb array 184 of hexagonal shapes 186, which has one hundred and twenty degree rotational symmetry. Square arrays have ninety degree and one hundred and eighty degree rotational symmetry. Further arrays are readily devised. Showerhead tiles may be arrayed with or without spaces between the tiles or groups of tiles and with or without flanges.

Referring again to FIGS. 1-9 depicting showerhead tiles, tiled showerheads and a tiled showerhead fixture, FIGS. 10-11 depicting showerhead reactors, FIGS. 12-14 depicting substrates being processed in parallel and/or series and FIGS. 15A-15G depicting arrays for tiling showerhead tiles, a full range of variations and combinations of tiled showerheads and single-chamber, multiple-chamber, linear and modular showerhead reactors can be appreciated. A tiled showerhead processes wafers or other substrates side-by-side in parallel. Successive processing can be applied under the same showerhead in the same chamber and/or under a further showerhead in a further chamber.

In a long, linear reactor, whether designed as a single reactor or a modular reactor having multiple modules, a series of showerheads is placed along the length of the reactor in one or more chambers. Each chamber is widened to process wafers side-by-side, as is any passageway from one chamber to another. Each tiled showerhead directs processing gas to the respective substrates. Exhaust channels or ports direct exhaust gas flows from substrates. Gas isolation curtains can be provided by gas flows emanating from tiled showerheads so equipped with gas isolation apertures. A lid of the reactor can be integrated with gas conduits, can be integrated with showerhead fixtures, or can be separate from such.

A standard, single-wafer showerhead reactor is usually of a cold-wall or hot-wall type. A cold-wall reactor has walls that are not expressly heated, and can experience a condensation of particles on the cold walls from reactions of the various process gases. A hot-wall reactor has walls that are expressly heated, and can experience reactions on the heated walls.

In contrast, a "zero" or no wall reactor has a chamber with no physical walls, and has instead walls that are created by gas flows such as gas isolation curtains. The "zero" wall reactor has many or all of the benefits of cold-wall and hot-wall reactors with fewer or none of the drawbacks of either. Physical walls outside of the isolation zones prevent contamination from the atmosphere, i.e. gases arriving from outside of a deposition zone, and allow overall pressure control. Thus, the "zero" wall reactor does have physical walls, but the reaction or deposition chamber within the reactor is defined by isolation zones having gas isolation curtains or other gas flows. Exhaust zones pull gases away from substrates, so that contaminants such as arsenic or other processing leftovers or byproducts are not passed along to other wafers outside of a processing zone. Pressure balancing is applied among process gas flows, exhaust gas flows and gas isolation curtain flows. Examples of tiled showerheads having provision for an exhaust gas flow and/or a gas isolation curtain flow can be used in a "zero" wall showerhead reactor.

Isolation zones with gas curtain "walls" allow a mechanically simpler apparatus that does not have mechanical doors opening and closing when a substrate is moved from one processing zone to another processing zone, although mechanical doors or the like could be used. As an example, a deposition e.g. an epitaxial deposition can be applied in a first zone, with a further deposition applied in a second zone, followed by cleaning in the second or in a third zone, and further followed by etching in a fourth or subsequent zone, with processing zones separated by isolation zones. A "train" of substrate carriers can proceed one after the other, with substrates being processed in parallel in each processing zone, and substrates being processed in series in subsequent processing zones and subsequent modules.

By combining parallel processing of a group or an array of substrates under a tiled showerhead and serial processing through subsequent processing zones or modules having one or more further tiled showerheads, throughput of substrates is greatly increased as compared to a single-substrate showerhead reactor or as compared to a series processing single-substrate-wide showerhead reactor. Multiple examples of a long, linear showerhead reactor or of a modular showerhead reactor including multiple modules, each of which uses one or more tiled showerheads, can be arrayed horizontally or vertically or both for further improvements in substrate processing throughput.

One of the advantages of a modular showerhead is that very large substrates may be processed at a single time. For example, large area P-N junctions can be formed, then diced into smaller pieces, or used as a large panel. A modular showerhead formed by groups of array of tiles would be appropriate to processing large substrates. Another advantage is that each showerhead tile may process a plurality of substrates.

What is claimed is:

1. A showerhead for a semiconductor-processing reactor, comprising:
    an array of showerhead tiles, with each showerhead tile having a plurality of process gas apertures in a central area of the showerhead tile and a border, the border of each tile in contact with and connected to a border of at least one other tile, each showerhead tile of the array being dimensioned for processing a plurality of substrates; and an exhaust region surrounding the process gas apertures and including a surface extending from one or more central areas of one or more of the showerhead tiles, the exhaust region having at least one exhaust aperture in the surface.

2. The showerhead of claim 1 wherein each showerhead tile of the array of showerhead tiles is dimensioned for processing 4, 6 or 9 substrates.

3. The showerhead of claim 1 wherein the exhaust region surrounds the array of showerhead tiles.

4. The showerhead of claim 1 wherein the exhaust region is a part of each showerhead tile and surrounds the process gas apertures of each showerhead tile.

5. The showerhead of claim 1 wherein the at least one exhaust aperture includes a plurality of exhaust apertures.

6. The showerhead of claim 1 further comprising a flange surrounding the exhaust region and having a surface extending from the exhaust region surface.

7. The showerhead of claim 1 wherein each showerhead tile is square, circular, rectangular or polygonal.

8. The showerhead of claim 1 wherein each showerhead tile has at least one gas curtain aperture between the exhaust region and the plurality of process gas apertures.

9. The showerhead of claim 1 wherein each showerhead tile includes at least one gas curtain aperture.

10. The showerhead of claim 1 wherein the array of showerhead tiles is a square array.

11. The showerhead of claim 1 wherein the array of showerhead tiles is a rectangular array.

12. The showerhead of claim 1 wherein the array of showerhead tiles has a rotational symmetry.

13. A showerhead for a semiconductor-processing reactor, comprising:

an array of showerhead tiles, each showerhead tile having a border and a plurality of process gas apertures in a central area of the showerhead tile with at least one fluid passageway adjacent to the central area of the showerhead tile, the border of each tile in contact with and connected to a border of at least one other tile, each showerhead tile of the array being dimensioned for processing a plurality of substrates; and a plurality of exhaust regions, each exhaust region surrounding the central area of each showerhead tile, each exhaust region including a surface extending from the central area of each showerhead tile, and each exhaust region having at least one exhaust aperture in the surface.

14. The showerhead of claim 13, wherein each showerhead tile of the array of showerhead tiles is dimensioned for processing 4, 6 or 9 substrates.

15. The showerhead of claim 13 wherein, on each showerhead tile, the at least one fluid passageway includes two cooling passageways.

16. The showerhead of claim 13 wherein, on each showerhead tile, the at least one fluid passageway includes two gas passageways fluidly connected to gas curtain apertures.

17. The showerhead of claim 13 wherein, on each showerhead tile, the at least one fluid passageway is between a portion of the central area and a portion of the exhaust region.

18. A showerhead for a semiconductor-processing reactor, comprising:

an array of showerhead tiles, each showerhead tile having a border, a plurality of process gas apertures in a central area of the showerhead tile and at least one fluid passageway adjacent to the central area of the showerhead tile, the border of each showerhead tile in contact with and connected to a border of at least one other showerhead tile; and an exhaust region surrounding the array of showerhead tiles and including a surface extending from the central areas of the showerhead tiles, the exhaust region having at least one exhaust aperture in the surface.

19. The showerhead of claim 18 wherein each showerhead tile of the array of showerhead tiles is dimensioned for processing a plurality of substrates.

20. The showerhead of claim 18 further including a gas curtain region surrounding the array of showerhead tiles and having a plurality of gas curtain apertures, wherein the exhaust region surrounds the gas curtain region.

* * * * *